United States Patent

Van Dijk

[15] 3,640,807

[45] Feb. 8, 1972

[54] METHOD OF MANUFACTURING A SEMICONDUCTOR DEVICE AND SEMICONDUCTOR DEVICE MANUFACTURED BY SAID METHOD

[72] Inventor: Hendrikus Josephus Antonius Van Dijk, Emmasingel, Eindhoven, Netherlands

[73] Assignee: U.S. Philips Corporation, New York, N.Y.

[22] Filed: July 1, 1970

[21] Appl. No.: 51,575

[30] Foreign Application Priority Data

July 4, 1969 Netherlands..........................6910274

[52] U.S. Cl. .....................204/143 GE, 148/175, 204/143 R

[51] Int. Cl..........................................................B23p 1/00

[58] Field of Search........................204/143 R, 143 GE, 164; 148/175

[56] References Cited

FOREIGN PATENTS OR APPLICATIONS 6,703,013 8/1968 Netherlands...........................204/143

*Primary Examiner*—John H. Mack
*Assistant Examiner*—Neil A. Kaplan
*Attorney*—Frank R. Trifari

[57] ABSTRACT

The invention relates to a method of manufacturing semiconductor devices having thin layers of a semiconductor material.

These thin layers are obtained, for example, by forming on a low-ohmic substrate a high-ohmic thin layer and then selectively removing the substrate electrolytically. Difficulties can arise during this removal when a readily conductive layer has been formed on the high-ohmic layer. The difficulties are prevented when the thickness of the high-ohmic layer is at least as large as the thickness of the depletion layer which is formed in the high-ohmic layer during the electrolytic removal of the substrate.

8 Claims, 9 Drawing Figures

Figure 1:
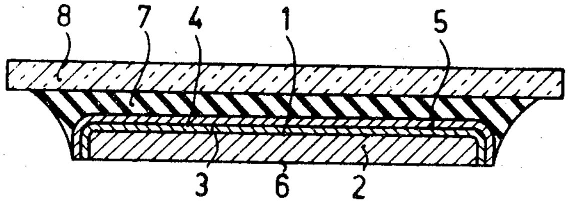

INVENTOR.
HENDRIKUS J.A.VAN DIJK
BY
[signature]
AGENT.

PATENTED FEB 8 1972

3,640,807

INVENTOR.
HENDRIKUS J.A. VAN DIJK

BY

AGENT.

METHOD OF MANUFACTURING A SEMICONDUCTOR DEVICE AND SEMICONDUCTOR DEVICE MANUFACTURED BY SAID METHOD

The invention relates to a method of manufacturing a semiconductor device in which a layer of a high-ohmic semiconductor material is formed on the surface of one side of a body of a low-ohmic semiconductor material, hereinafter termed substrate, after which the substrate is removed by a selective electrolytic etching treatment while maintaining the high-ohmic layer, and to a semiconductor device manufactured by means of the method.

The above-mentioned high-ohmic layer can be formed in a normal manner, for example, by epitaxial deposition. The resistivity for a high-ohmic layer, for example, of silicon, is chosen to be higher than 0.3 ohm.-cm.

A method of the type mentioned in the preamble is described in the published Dutch Pat. application No. 6,703,013 according to which during the electrolytic etching treatment a voltage is applied at which the material of a high-ohmic layer of the N-type at the boundary between said layer and a substrate of a low-ohmic semiconductor material of the N-type is substantially not dissolved or is dissolved comparatively slowly relative to the material of the substrate adjoining the layer. As a result of this it is possible to obtain thin semiconductor bodies of a uniform thickness which can be further processed to semiconductor devices, for example, to integrated circuits having parts which are separated from each other, for example, by insulation material or by air, to target plates for camera tubes in particular of the vidicon type, to semiconductor devices having PN junctions which extend transverse to the surface from one side of the semiconductor body to the other side of the semiconductor body, (so-called flat land structures), and to other semiconductor devices, in particular those in which the very small thickness of the semiconductor body can be used.

It has been found in manufacturing thin semiconductor bodies, for example, when, prior to etching, considerable parts of the semiconductor device to be manufactured are formed, that the high-ohmic layer can sometimes be attacked, for example, can be etched through locally. This attack can be such that an incoherent assembly is obtained which can be easily removed mechanically.

It has furthermore been found that this etching-through occurs when, prior to the etching, the high-ohmic layer is provided with a low-ohmic layer of a semiconductor material which in the semiconductor device to be manufactured serves as a buried layer, for example, to reduce the collector series resistance of a transistor. Etching-through of the high-ohmic layer has also been established when same is provided with a metal layer having a pattern of conductive tracks and contact surfaces for the semiconductor device.

It has been found that said difficulties of etching-through of the high-ohmic layer occur when same is provided with a layer of a readily conducting material. The last-mentioned layer can then also be attacked during the electrolytic etching treatment.

It has also been established that, also when the readily conductive layer forms no cohering assembly and consists of geometrically separated regions, the above-mentioned difficulties of attack of the high-ohmic layer can occur.

If the readily conducting layer consists of a semiconductor material, eight situations may arise, namely the combinations $N^+NN^+$, $N^+NP^+$, $P^+NN^+$, $P^+NP^+$, $N^+PN^+$, $P^+PN^+$, $N^+PP^+$ and $P^+PP^+$. If the readily conductive layer consists of a metal, there are another four combinations namely $MNN^+$, $MNP^+$, $MPN^+$ and $MPP^+$. The combinations are stated in the sequence: readily conductive layer-high-ohmic layer-substrate.

Of the 12 combinations, three are omitted namely those in which both the high-ohmic layer and the substrate consist of a P-type semiconductor material. In these three cases there can be no question of a substrate which is removed while maintaining the high-ohmic layer, since in these cases both the substrate and the high-ohmic layer dissolve.

It is the object of the invention to avoid at least considerably the above-mentioned difficulties of attack of the high-ohmic layer and the readily conductive layer.

It is based on the recognition of the fact that this is possible when it is ensured that in the presence of a readily conductive layer a depletion region which is formed in the high-ohmic layer during the electrolytic etching process cannot extend throughout the thickness of said layer.

According to the invention, the method mentioned in the preamble is characterized in that prior to etching a layer of a readily conductive material is formed on the surface of the high-ohmic layer, which readily conductive layer is separated from the substrate by the high-ohmic material, the high-ohmic material present between the substrate and the readily conductive layer being given a thickness which is at least equal to the thickness of the depletion region forming in the high-ohmic material during the electrolytic etching treatment.

The method according to the invention has the advantage that during the electrolytic etching treatment the high-ohmic layer and the readily conductive layer are substantially not attacked or are attacked comparatively slowly relative to the substrate.

A possible explanation will be given hereinafter with reference to the description of the Figures, in which inter alia the part of the readily conductive layer with the described difficulties will be treated.

The thickness of the depletion region forming in the high-ohmic layer during the electrolytic etching depends upon a large number of factors, for example, the semiconductor material, the conductivity type, the concentration of the doping impurities, the mobility of the charge carriers and the voltage used during the electrolytic etching treatment.

In a preferred embodiment of the method according to the invention silicon is used for the high-ohmic material and $$\frac{d^2|N_D-N_A|}{V}$$

is chosen to be $\geq 1.25\times10^{15}$, in which $d$ is the thickness of the high-ohmic material between the substrate and the readily conductive layer in $\mu$m, $|N_D-N_A|$ is the absolute value of the difference between the concentrations of the donors ($N_D$) and the acceptors ($N_A$) in the high-ohmic layer in at/cc., and $V$ is the voltage in Volts used during the electrolytic etching treatment.

If the said relationship is fulfilled by the said variables, the depletion region cannot extend throughout the thickness of said high-ohmic layer provided that the high-ohmic layer is of a good quality. It may occur that defects are present locally in the high-ohmic layer. Therefore, $$\frac{d^2|N_D-N_A|}{V}$$

is preferably chosen to be $\geq 2\times10^{15}$.

As is known, $|N_D-N_A|$ is inversely proportional to the mobility and the resistivity and if desirable the quantity $|N_D-N_A|$ can be determined from the last-mentioned two quantities.

In practice, favorable results are obtained by means of the method according to the invention when the high-ohmic layer is given a thickness which is at least 5 $\mu$m. A high-ohmic layer of the N-type is preferably given a resistivity which is at least 1 ohm.-cm.

A high-ohmic P-type layer is preferably given a resistivity which is at least 0.5 ohm.-cm.

The high-ohmic layer is preferably given a resistivity which is at most 10 ohm.-cm.

The high-ohmic layer remaining after the etching treatment can in many cases be maintained without objection and possibly be used in the semiconductor device to be manufactured. However, if the maintenance of the high-ohmic layer is undesirable, said layer can be removed at least partly in known manner by a chemical etching process.

The invention furthermore relates to a semiconductor device manufactured by means of the method according to the invention.

Figure 2:
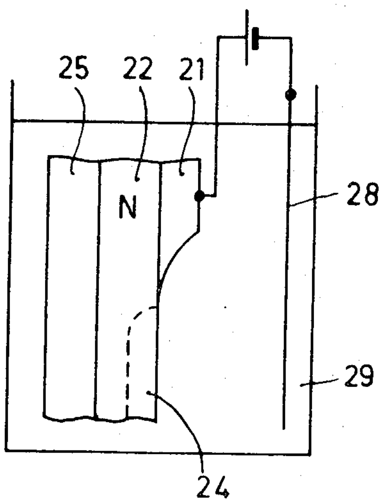
Figure 3:
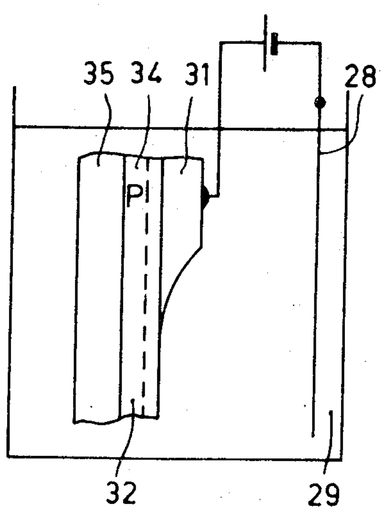
Figure 4:
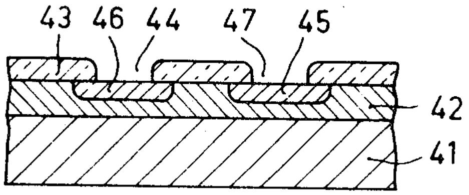
Figure 5:
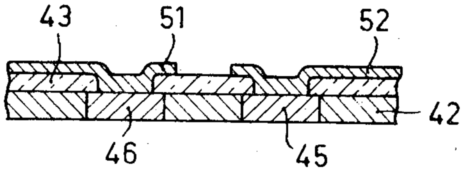
Figure 6:
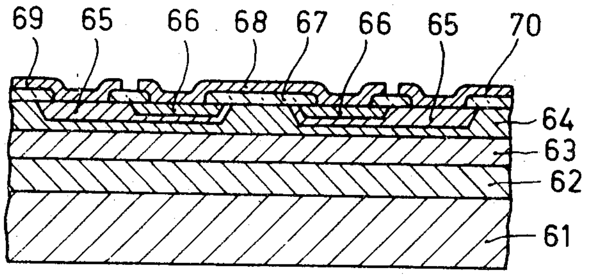
Figure 7:
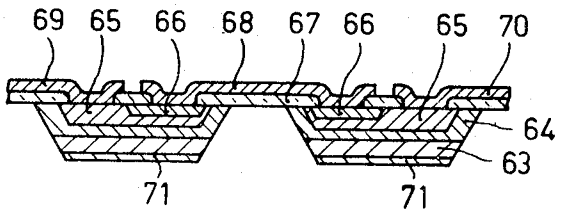
Figure 8:
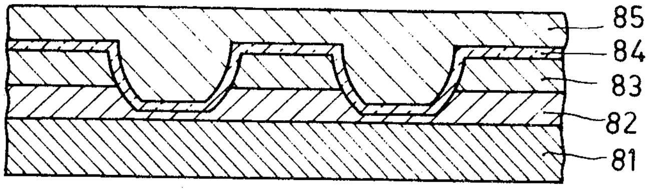
Figure 9:
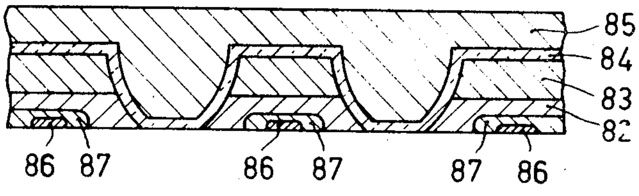

In order that the invention may be readily carried into effect, a few examples thereof will now be described in greater detail, by way of example, with reference to the accompanying drawings, in which:

FIG. 1 is a diagrammatic cross-sectional view of a semiconductor device in a stage of manufacture prior to the electrolytic etching treatment, when using the method according to the invention, FIG. 2 is a diagrammatic cross-sectional view of a part of a semiconductor device during the electrolytic etching treatment when using the method according to the invention, FIG. 3 is a diagrammatic cross-sectional view of a part of another semiconductor device during the electrolytic etching treatment when using the method according to the invention, FIGS. 4 and 5 are diagrammatic cross-sectional views of a part of a semiconductor device in successive stages of manufacture when using the method according to the invention, FIGS. 6 and 7 are diagrammatic cross-sectional views of a part of another semiconductor device in successive stages of manufacture when using the method according to the invention, FIGS. 8 and 9 are diagrammatic cross-sectional views of a part of still another semiconductor device in successive stages of manufacture, when using the method according to the invention.

In the method of manufacturing the semiconductor device according to the invention, a layer 3 of a high-ohmic semiconductor material is formed, for example, by epitaxial deposition, for example, on the surface 1 of a side of a substrate 2 (see FIG. 1) of a low-ohmic semiconductor material. Prior to removing the substrate 2 by an electrolytic etching treatment, a layer of a readily conducting material 5 is formed, for example, also by epitaxial deposition of semiconductor material, on the surface 4 of the high-ohmic layer. During the epitaxial deposition, material will be deposited also on the side 6 of the substrate situated opposite to the side 1. This material can be removed in any conventional manner. The substrate 2 is adhered to a support 8, for example, glass, by means of a layer 7 of a suitable adhesive, for example, beeswax, in such manner that the side 6 of the substrate remains free.

In a conventional manner (see, for example, the published Dutch Pat. application No. 6,703,013), the substrate is then given a potential suitable for etching relative to an electrode which is immersed with the substrate in a suitable etching bath (see FIGS. 2 and 3).

The following explanation could be given for the above-mentioned difficulties which can occur during the electrolytic etching treatment due to the presence of a readily conducting layer, and the effect of the method according to the invention.

First of all we start from the above-mentioned case (see FIG. 2), in which a high-ohmic layer 22 of the N-type is formed on a substrate 21 of a low-ohmic semiconductor material of the N-type. The substrate 21 is now removed in an electrolytic etching process by giving it a suitable potential of, for example, +10 volt relative to an electrode 28 which is immersed in a suitable etching bath 29 with the substrate. It has been assumed herein after that the etching liquid has no resistance of any significance. A current now flows between the substrate 21 and the electrode 28 and etching of the substrate occurs. The high-ohmic layer 22 also has a potential of 10 volts relative to the etching bath. At the area where the substrate is removed, the high-ohmic layer 22 will have a depletion region in which the high-ohmic layer 22 is substantially not attacked or is attacked comparatively slowly relative to the part of the substrate 21 still to be etched away.

The high-ohmic layer can be attacked indeed if on said layer a readily conducting layer 25 of, for example, low-ohmic semiconductor material of the N-type is present. When, actually, the voltage used during the electrolytic etching treatment is so high that the depletion region reaches the readily conducting layer 25 which likewise has a potential of 10 volt, the high-ohmic layer 22 and then also the readily conducting layer 25 will be attacked by an avalanchelike development of charge carriers in the readily conducting layer 25.

The explanation remains the same as in the above mentioned $N^+NN^+$-case if the substrate 21 consists of low-ohmic semiconductor material of P-type (the $N^+NP^+$-case).

If the readily conductive layer 25 consists of low-ohmic semiconductor material of the P-type (the $P^+NN^+$-case and the $P^+NN^+$-case) the same explanation also applies on the understanding that the voltage of the readily conductive layer 25 amounting to the diffusion voltage across the PN junction between the layers 22 and 25 can be lower than the applied voltage.

The possibility which arises when the high-ohmic layer 22 is of the P-type will now be considered.

A substrate of the P-type can be left out of consideration, (the cases $N^+PP^+$ and $P^+PP^+$), because, as already noted, the high-ohmic layer is not maintained in these cases during the electrolytic etching process. Two possibilities remain in which hence a high-ohmic layer is formed of the P-type on a low-ohmic substrate of the N-type ($P^+PN^+$ and $N^+PN^+$).

During the electrolytic etching process the high-ohmic P-type layer 32 (see FIG. 3) shows a depletion region 34 on the side of the substrate material 31 still to be etched away.

If a readily conductive layer 35 of a semiconductor material of the P-type is present on the high-ohmic layer 32 ($P^+PN^+$) and the depletion region 34 in the high-ohmic layer 32 reaches the readily conductive layer 35, charge carriers are generated there in an avalanchelike manner so that the high-ohmic layer 32 and the readily conductive layer 35 can be attacked. In the case in which the readily conductive layer 35 consists of N-type semiconductor material ($N^+PN^+$) a corresponding explanation applies.

When the readily conductive layer consists of a metal, corresponding explanations apply as when said layer consists of a semiconductor material.

The advantage of the method according to the invention has been demonstrated with a number of experiments in which a high-ohmic layer of N-type or P-type was formed on a low-ohmic substrate on which layer a readily conductive layer was then applied. The results are recorded in the following table.

The number of the experiment is stated in column 1. The conductivity type of the silicon used for the high-ohmic layer is stated in column 2, the thickness in $\mu$m. of the layer used is stated in column 3, the value of $|N_D-N_A|$ in at/cc. is stated in column 4, the value of the product $d^2$ $|N_D-N_A|$ is stated in column 5 and it is stated in column 6 whether, in the presence of a readily conductive layer, the high-ohmic layers remain intact (+) or not intact (−) upon etching away the substrate.

It is to be noted that $|N_D-N_A|$ has been calculated from the resistivity, measured in a conventional manner according to the four-point method, and the mobility as the latter is known for homogeneous bulk materials

| 1 | 2 | 3 | 4 | 5 | 6 |
|---|---|---|---|---|---|
| 1 | n | 10 | $8\times10^{14}$ | $8\times10^{16}$ | + |
| 2 | n | 5 | $7.5\times10^{13}$ | $0.19\times10^{16}$ | − |
| 3 | n | 5 | $8\times10^{14}$ | $2\times10^{16}$ | − |
| 4 | p | 2 | $2.2\times10^{15}$ | $1.28\times10^{16}$ | − |
| 5 | p | 5 | $2.5\times10^{16}$ | $55\times10^{16}$ | + |
| 6 | p | 5 | $3.2\times10^{14}$ | $0.8\times10^{16}$ | − |

The voltage used during the electrolytic etching treatment was 10 volts. So it appears from the table that for the experiments 1 and 5 it holds that $d^2$ $|N_d-N_a|$ $>2\times10^{16}$.

It has been found moreover that the attack of the high-ohmic layer observed in experiments 4 and 6 is significantly smaller than in experiment 2.

EXAMPLE I

FIG. 4 is a vertical cross-sectional view of an antimony-doped N-type silicon disk, approximately 300 $\mu$m. thick, diameter 2 cm. The resistivity of the N-type material of the substrate 41 is 0.007 ohm.-cm. The low-ohmic substrate has been obtained from a rod-shaped monocrystal of silicon by sawing transverse to the longitudinal direction of said crystal after which the surface is further ground down to the thickness indicated. The substrate is then pretreated in normal manner in which one side is polished with aluminum oxide having a grain size of approximately 0.05 $\mu$m. and etched in gaseous HCl which is mixed with hydrogen. During the last-mentioned treatment the substrate is heated to approximately 1,100° C.

A high-ohmic layer 42 is then provided epitaxially in known manner on one side of the substrate, the material of the layer consisting of N-type silicon having a resistivity of 5 ohm.-cm. ($N_D-N_A$=$8\times10^{14}$). The epitaxial layer 42 can be obtained, for example, by conducting a gas mixture of silicon tetrachloride and hydrogen to which a little phosphorus hydride has been added along the substrate 41, said body being heated at a temperature of 1,050° C.

The epitaxial deposition is continued for 15 minutes, a layer thickness of 15 $\mu$m. being obtained. A silicon oxide layer 43 is then formed by oxidation in moist oxygen at a temperature of 1,100° C., in which layer an aperture 47 is provided by means of a suitable photoresist method. A boron-doped layer 45 which has a thickness of 2 $\mu$m. is then formed by means of a boron diffusion treatment.

In a manner corresponding to the provision of the aperture 47, an aperture 44 is then made in the oxide layer 43. Phosphorus is then diffused in a usual manner in the high-ohmic layer 42 through the aperture 44, a phosphorus-doped, readily conductive layer 46 being formed which has a thickness smaller than 3 $\mu$m. and a resistivity of 0.001 ohm.cm.

The phosphate glasses and borate glasses, respectively, formed in the apertures 44 and 47 on the readily conductive layer 46 and the layer 45 are removed in a usual manner, after which the layers are contacted with the conductive tracks 51 and 52, respectively. (see FIG. 5). The object of the readily conductive layer 46 is to enable an ohmic contact between the conductive track 51 and the high-ohmic layer 42. The layer 45 forms a PN-junction with the high-ohmic layer 42.

The resulting semiconductor body is now secured to a glass support by means of beeswax.

A platinum connection is then clamped against the side of the substrate by means of a clamp of synthetic resin which is HF-resistant, for example, polymethyl metacrylate.

The etching liquid used consists of 1 part by volume of concentrated hydrofluoric acid (50 percent by weight) and 10 parts by volume of water. A platinum electrode is provided in the bath and consists of platinum gauze secured to a platinum rod which projects partly above the etching liquid and to which the electrode can be connected electrically.

The substrate and the electrode are immersed in the etching bath, the substrate being given a positive potential of 10 volts relative to the electrode. The etching rate is approximately 2 $\mu$m. per minute.

When as a result of the etching-away of the substrate 41 the etching liquid contacts the high-ohmic layer 42, the etching process stops in spite of the presence of the readily conductive layer 46. The high-ohmic layer is then etched away chemically in known manner until the layers 45 and 46 are reached. In this manner the configuration shown in FIG. 5 and representing a part of a flatland structure in which a diode occurs is obtained.

EXAMPLE II

A high-ohmic layer 62 of P-type silicon having a resistivity of 1 ohm.cm. ( $|N_D-N_A|$ $=1.5\times10^{16}$) is epitaxially deposited on one side of a substrate 61 (see FIG. 6) which has been obtained from a rod-shaped monocrystal grown in the <100> direction and which consists of antimony-doped N-type silicon having a resistivity of 0.007 ohm.-cm. and dimensions according to Example I, until a layer thickness of 5 $\mu$m. has been obtained. The layer 62 is provided epitaxially with the readily conducting layer 63 of N-type silicon having a thickness of 5 $\mu$m. and a resistivity of 0.05 ohm.-cm. A layer 64 of N-type silicon having a thickness of 5 $\mu$m. and a resistivity of 20 ohm.-cm. is deposited also epitaxially on the layer 63. In said layer 64, P-type base regions 65 and N-type emitter regions 66 are formed in a usual manner by diffusion treatments, through apertures in an oxide layer 67. The base regions 65 are then provided likewise in a usual manner with connection conductors 69 and 70 and the emitter regions 66 are provided with connection conductor 68. As in Example I, the semiconductor body is then adhered to a glass plate with the side on which the connection conductors are situated, by means of an etchant-resistant agent, for example, a material which is commercially available under the trade name araldite. The substrate 61 is then removed electrolytically in the manner as described above. During the electrolytic etching treatment, the layers 62 and 63 are not attacked. The high-ohmic layer 62 is then removed by a chemical etching treatment. The exposed readily conductive layer 63 is then covered with a copper layer 71 by electrodeposition (see FIG. 7). At first the copper layer 71 serves as an etching mask for the subsequent anisotropic etching process. During this process the layers 63 and 64 are etched through in a usual manner, in a bath which contains KOH and isopropanol, via apertures in the layer 71. In the transistor structure shown in FIG. 7 having air-insulated circuit elements, both the readily conducting layer 63 and the metal layer 71 serve to reduce the collector series resistance of the layer 64. The layer 71 is of importance because then the layer 63 need not have too low a resistance which can be advantageous in the formation via an epitaxial process. For a good ohmic contact of the layer 71 with the layer 63 the resistance of the layer 63 may not be too high.

EXAMPLE III

Instead of adhering the substrate to a glass support by means of an adhesive, for example, beeswax, the side of the substrate 81 (see FIG. 8) having the epitaxial layers 82 and 83 which have already been provided with a suitable oxide coating 84, can be provided with polycrystalline silicon by decomposition of a suitable silicon compound, as a result of which a permanent temperature-resistant support is formed. The method is analogous to that in the preceding examples. The high-ohmic layer of N-type silicon has a thickness of 10 $\mu$m. and a resistivity of 5 ohm.-cm. ( $|N_D-N_A|$ $=8\times10^{14}$). The readily conductive layer 83 consists of N-type silicon, has a thickness of 5 $\mu$m. and a resistivity of 0.05 ohm.-cm., and is formed by epitaxy on the high-ohmic layer 82. By means of a conventional photoresist method, apertures are etched in the layers 82 and 83, on the understanding that the layer 82 is not fully etched through. During the electrolytic etching treatment the layer 82 is not yet divided into semiconductor regions separated from each other and the layer 82 still forms a coherent assembly. The layer 84 of silicon oxide is then formed at elevated temperature by oxidation.

The polycrystalline silicon 85 can be provided in a sufficient layer thickness so as to obtain a rigid self-supporting assembly, for example, in a thickness of from 100 to 200 $\mu$m. During a growing process by the decomposition of $SiCl_4$ in the presence of hydrogen at a temperature of the surface to be coated of 1,050° C., the growth in thickness is, for example, approximately 1 $\mu$m. per minute.

In the subsequent electrolytic etching treatment the substrate 81 is removed while maintaining the high-ohmic layer 82 and the readily conductive layer 83, after which a part of the layer 82 is removed chemically in such manner that a structure is obtained having semiconductor regions of the original layers 82 and 83 separated from each other by the oxide layer 84.

Base regions 87 and emitter regions 86 can be diffused in a usual manner in the regions of the layer 82 and be provided with connection conductors. In the transistor structure shown in FIG. 9, the silicon layer 83 serves to reduce the collector series resistance.

Of course many variations are possible to those skilled in the art without departing from the scope of the present invention.

For example, other compositions of the etching bath may be used. For the selective electrolytic etching, for example, etching baths were successfully used which consisted of mixtures of 1 part by volume of concentrated HF (50 percent by weight) and from 6 to 10 parts of a solution of 200 g. of $NH_4F$ in 100 g. of water.

The invention is not restricted to the use of silicon as a semiconductor material. Other semiconductor materials, for example, germanium, may be used. As a material for the readily conductive layer are to be considered also metals, for example, molybdenum.

Where in the above description the terms low-ohmic, high-ohmic and readily conductive are used in connection with the removal of the substrate and the attack by the high-ohmic and the readily conductive layer, said terms should be considered with respect to said different behavior during the electrolytic etching treatment, and not with respect to the properties in a semiconductor device.

What is claimed is:

1. A method of manufacturing a semiconductor device in which a layer of a high-ohmic semiconductor material is formed on the surface of one side of a body of a low-ohmic semiconductor material, hereinafter termed substrate, after which the substrate is removed by a selective electrolytic etching treatment while maintaining the high-ohmic layer, characterized in that prior to etching a layer of a readily conductive material is formed on the surface of the high-ohmic layer, which readily conductive layer is separated from the substrate by the high-ohmic material, the high-ohmic material present between the substrate and the readily conductive layer being given a thickness which is at least equal to the thickness of the depletion region forming in the high-ohmic material during the electrolytic etching treatment.

2. A method as claimed in claim 1, characterized in that for the high-ohmic material silicon is used and that $$\frac{d^2|N_D - N_A|}{V}$$

is chosen to be $\geq 1.25\times10^{15}$, in which $d$ is the thickness of the high-ohmic material between the substrate and the readily conductive layer in $\mu$m. $|N_D - N_A|$ is the absolute value of the difference between the concentrations of the donors ($N_D$) and the acceptors ($N_A$) in the high-ohmic layer in at/cc. and $V$ is the voltage in volts used during the electrolytic etching treatment.

3. A method as claimed in claim 2, characterized in that $$\frac{d^2|N_D - N_A|}{V}$$

is chosen to be $\geq 2\times10^{15}$.

4. A method as claimed in claim 2, characterized in that the high-ohmic layer is given a thickness of at least 5 $\mu$m.

5. A method as claimed in claim 2, characterized in that the high-ohmic layer is given N-type conductivity and a resistivity which is at least 1 ohm.cm.

6. A method as claimed in claim 2, characterized in that the high-ohmic layer is given P-type conductivity and a resistivity which is at least 0.5 ohm.-cm.

7. A method as claimed in claim 2, characterized in that the high-ohmic layer is given a resistivity of at most 10 ohm.-cm.

8. A method as claimed in claim 1, characterized in that after the electrolytic etching treatment, the high-ohmic layer is removed at least partly by a chemical etching process.

* * * * *

PO-1050
(5/69)

UNITED STATES PATENT OFFICE
CERTIFICATE OF CORRECTION

Patent No. 3640807 Dated Feb. 8, 1972

Inventor(s) HENDRIKUS JOSEPHUS A. VAN DIJK

It is certified that error appears in the above-identified patent and that said Letters Patent are hereby corrected as shown below:

Column 4, in the chart, under col. 4,
"$2.2X10^{15}$" should read --$3.2X10^{15}$--

"$2.5X10^{16}$" should read --$2.2X10^{16}$--

Signed and sealed this 4th day of July 1972.

(SEAL)
Attest:

EDWARD M.FLETCHER,JR.
Attesting Officer

ROBERT GOTTSCHALK
Commissioner of Patents